(12) United States Patent
Fukasawa

(10) Patent No.: US 11,386,843 B2
(45) Date of Patent: Jul. 12, 2022

(54) DISPLAY DEVICE AND MANUFACTURING METHOD THEREOF

(71) Applicant: Samsung Display Co., LTD., Yongin-si (KR)

(72) Inventor: Takayuki Fukasawa, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/928,458

(22) Filed: Jul. 14, 2020

(65) Prior Publication Data
US 2021/0201791 A1 Jul. 1, 2021

(30) Foreign Application Priority Data
Dec. 26, 2019 (KR) .................. 10-2019-0175608

(51) Int. Cl.
  *G09G 3/36* (2006.01)
  *G09G 3/3258* (2016.01)
  *H01L 51/56* (2006.01)

(52) U.S. Cl.
  CPC .......... *G09G 3/3258* (2013.01); *H01L 51/56* (2013.01); *G09G 2330/028* (2013.01); *G09G 2356/00* (2013.01)

(58) Field of Classification Search
  CPC ....... G09G 2300/0426; G09G 2380/02; G09G 3/2085; G09G 2300/023; G09G 2340/0464; G09G 3/3233; G09G 2330/02; G09G 2330/028; G09G 2356/00; G09G 2370/16; G09G 3/035; G09G 3/3258; G09G 2330/021; G09G 2300/0439; G09G 3/32; G09G 2300/0842; G09G 3/2074; H01L 51/56
  See application file for complete search history.

(56) References Cited

U.S. PATENT DOCUMENTS

| | | | |
|---|---|---|---|
| 8,035,609 B2* | 10/2011 | Kerr | H04N 5/32 345/102 |
| 9,852,691 B2* | 12/2017 | Hyun | G09G 3/3258 |
| 10,381,603 B2 | 8/2019 | Xu et al. | |
| 10,553,173 B2* | 2/2020 | Huang | G09G 3/3677 |
| 2018/0183133 A1* | 6/2018 | Yamazaki | H01Q 1/24 |
| 2019/0067640 A1 | 2/2019 | Dong | |
| 2019/0081275 A1 | 3/2019 | Jiao | |
| 2020/0020276 A1* | 1/2020 | Cho | G02F 1/136286 |

* cited by examiner

*Primary Examiner* — Duc Q Dinh
(74) *Attorney, Agent, or Firm* — Kile Park Reed & Houtteman PLLC

(57) ABSTRACT

A display device and a method of manufacturing the display device are provided. The display device includes a first display layer disposed on a surface of a display substrate and including a display element, a power supply unit that supplies a power signal to the display element, and a signal controller that supplies an image signal to the display element. The display element includes a base member, a pixel disposed on a surface of the base member, a driving circuit that provides a pixel driving signal to the pixel, a first transreceiver that receives the power signal and transmits the power signal to the driving circuit, and a second transreceiver that receives the image signal and transmits the image signal to the driving circuit.

20 Claims, 10 Drawing Sheets

FIG. 11
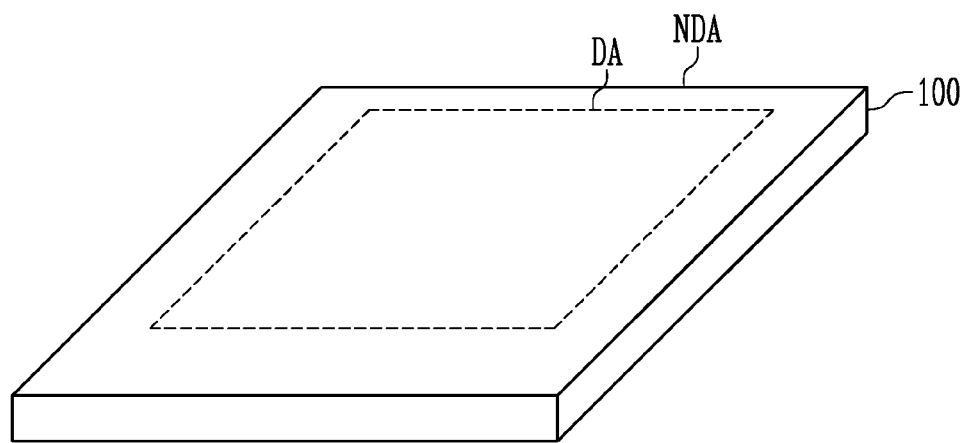
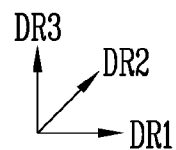

DISPLAY DEVICE AND MANUFACTURING METHOD THEREOF

CROSS-REFERENCE TO RELATED APPLICATION(S)

This application claims priority to and the benefit of Korean Patent Application No. 10-2019-0175608 under 35 U.S.C. § 119, filed in the Korean Intellectual Property Office on Dec. 26, 2019, the entire contents of which are incorporated herein by reference.

BACKGROUND

1. Technical Field

The invention relates to a display device and a method of manufacturing the display device.

2. Description of the Related Art

Display devices are becoming more important together with the development of multimedia technologies. Various display devices are being developed. Recent display devices include self-luminous devices such as organic light emitting diodes (OLED) and micro light emitting diodes (Micro-LED).

Sizes of the display devices are getting larger, and the display devices have various shapes including curved shapes of display devices. In order to manufacture large size display devices, a big-scale manufacturing apparatus and complicated manufacturing processes are required. As a result, the manufacturing cost and manufacturing time of display devices may substantially increase. In addition, in the manufacturing of the display devices having various shapes, for example, a curved shape, it is technically difficult and expensive to manufacture a self-luminous device directly on a substrate of such display devices.

Thus, it has been desired to provide a method of manufacturing display devices with various shapes and display devices manufactured by means of the method without causing a substantial cost increase and overcoming the technical difficulties.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments will become more apparent to one of ordinary skill in the art to which the disclosure pertains by referencing the detailed description of the disclosure given below.

A display device according to an embodiment may include a first display layer disposed on a surface of a display substrate and including a display element, a power supply that supplies a power signal to the display element, and a signal controller that supplies an image signal to the display element. The display element may include a base member, a pixel disposed on a surface of the base member, a driving circuit that provides a pixel driving signal to the pixel, a first transreceiver that receives the power signal and transmits the power signal to the driving circuit, and a second transreceiver that receives the image signal and transmits the image signal to the driving circuit.

The base member may have a ball-shape.

At least one of the first transreceiver and the second transreceiver may be disposed on the surface of the base member.

The pixel may include a first electrode layer disposed on the base member, an emission layer disposed on the first electrode layer, and a second electrode layer disposed on the emission layer. At least one of the first electrode layer, the emission layer, and the second electrode layer may be curved along the surface of the base member.

The emission layer may include an organic material.

The emission layer may include an inorganic material.

At least a portion of the driving circuit may be disposed between the base member and the first electrode layer.

The base member may have a flat plate shape, and the surface of the base member where the pixel may be disposed may have a flat shape.

The display element may have a size in a range from about 1 µm to about 500 µm.

The driving circuit may include a power storage circuit that stores the power signal and outputs a first voltage signal, and a voltage control circuit that generates a second voltage signal and a third voltage signal based on the first voltage signal.

The driving circuit may further include a memory circuit that stores position information of the display element and outputs a position information signal including the position information that generates a pixel control signal based on the image signal, the second voltage signal and the position information signal.

The driving circuit may further include a pixel control circuit that provides the pixel driving signal to the pixel based on the pixel control signal and the third voltage signal.

The first display layer may include a fixing layer disposed on the display element.

The display device may further include a second display layer disposed on the first display layer, wherein the second display layer may include the display element.

A method of manufacturing a display device according to an embodiment may include preparing a display substrate including a display area and a non-display area adjacent to the display area, dispersing display elements in a fixing material to form a mixture, and applying the mixture on a surface of the display substrate in the display area. The method may include forming a base member for each of the display elements, forming a pixel on the base member, forming a driving circuit that generates a pixel driving signal based on a power signal and an image signal and provides the pixel driving signal to the pixel, forming a first transreceiver that provides the power signal to the driving circuit, and forming a second transreceiver that provides the image signal to the driving circuit.

The method may further include emitting the display elements applied on the display substrate, and obtaining position information of each of the display elements to record the position information on a corresponding display element.

The method may further include storing the position information in a memory.

The method may further include forming a power supply on another surface of the display substrate to supply the power signal to the display elements, and forming a signal controller on the non-display area to supply the image signal to the display elements.

The method may further include forming a bank surrounding the display area in the non-display area before the applying of the mixture.

The method may further include recording position information on at least two of the display elements, and recording position information on others of the display elements by use of a communication between the at least two of the display elements.

Particularities of other embodiments are included in the detailed description and drawings.

In the above and other embodiments, it is possible to form a small size display element that may perform a display function alone by wirelessly receiving a power signal and an image signal, and to apply a mixture of the display elements on a display substrate of a display device. Accordingly, it is capable of manufacturing large size display devices or display devices having various shapes without causing a cost increase.

The above and other effects are available and included in the disclosure.

BRIEF DESCRIPTION OF THE DRAWINGS

FIGS. 11 to 13 are schematic perspective views for illustrating a manufacturing method of a display device according to an embodiment.

DETAILED DESCRIPTION OF THE EMBODIMENTS

Figure 1:
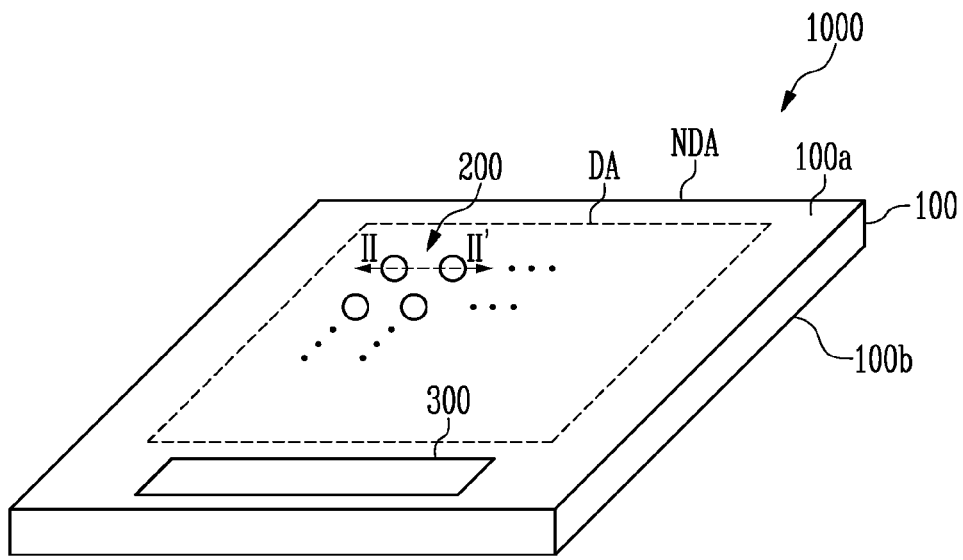
FIG. 1 is a schematic perspective view of a display device according to an embodiment.

Embodiments of display devices and methods of manufacturing the display devices will be described with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or a layer is referred to as being 'on' another element or layer, it can be directly on another element or layer, or intervening element or layer may also be present. The same reference numerals designate the same elements throughout the specification. The shapes, sizes, ratios, angles, numbers, and the like disclosed in the drawings for describing embodiments are illustrative, and thus the invention is not limited to the illustrated embodiments.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the invention. When explaining the singular, unless explicitly described to the contrary, it may be interpreted as the plural meaning.

Each of the features of the various embodiments of the invention may be coupled or combined with each other partly or entirely, and may be technically variously interlocked and driven in a manner that is sufficiently understandable to those skilled in the art. Each embodiment may be practicable independently of each other and may be practicable with together in an interrelationship.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the term "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Hereinafter, referring to the accompanying drawings, an embodiment will be described in further detail. The same or similar reference numerals may be used for the same constituent elements on the drawing.

Figure 2:
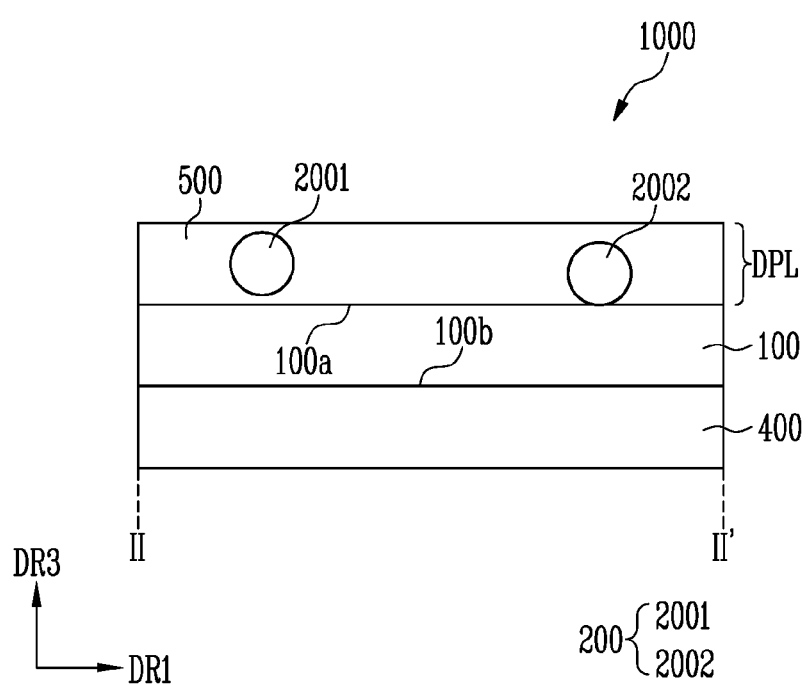
FIG. 2 is a schematic cross-sectional view of a display device taken along line II-II' of FIG. 1.
Figure 3:
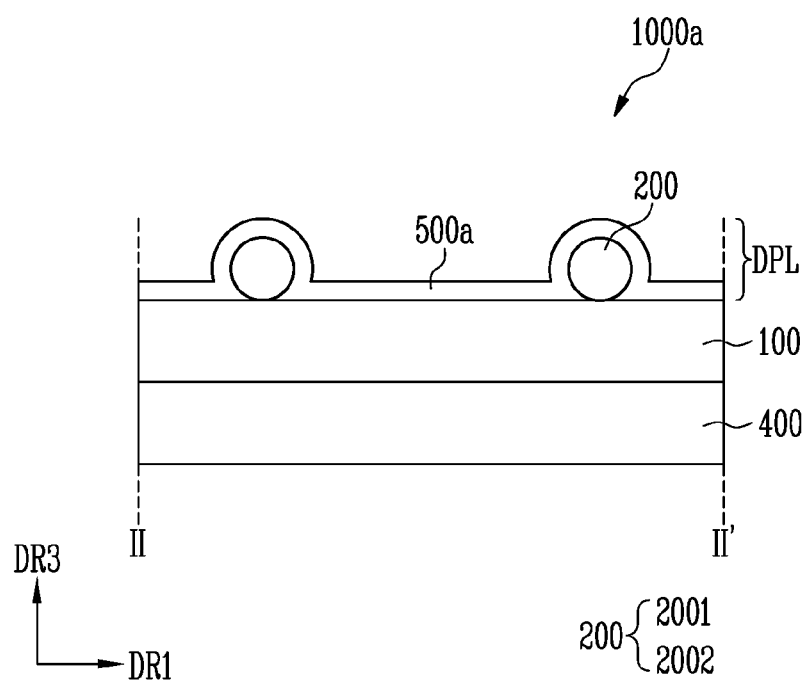
FIGS. 3 and 4 are schematic cross-sectional views of display devices according to various embodiments, and are cross-sectional views corresponding to line II-II' of FIG. 1.
Figure 4:
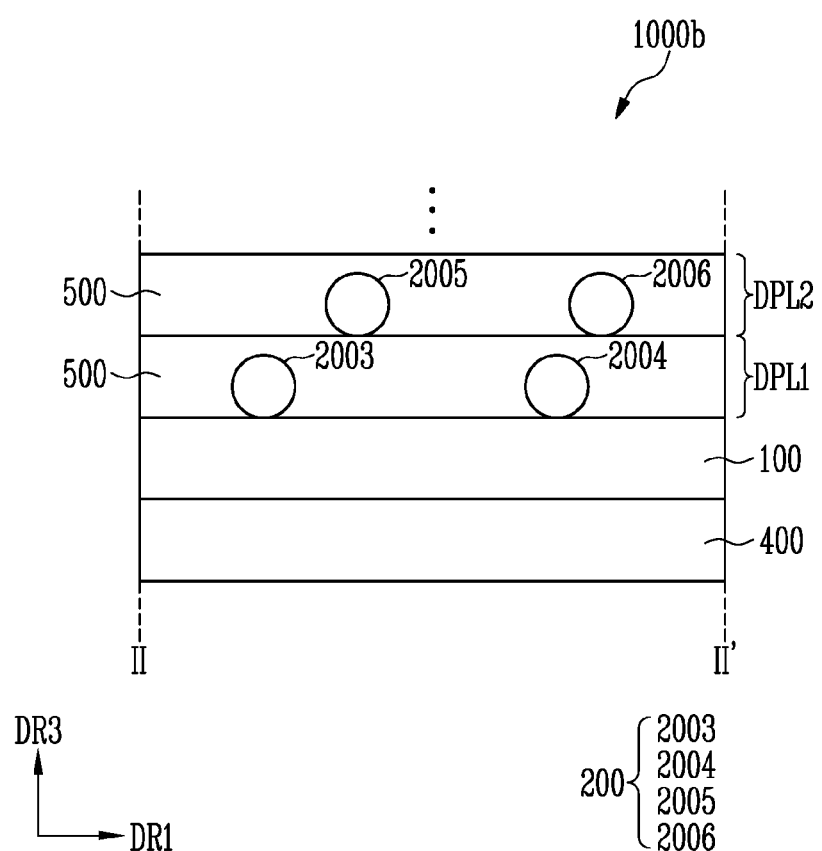

FIG. 1 is a schematic perspective view of a display device according to an embodiment. FIG. 2 is a schematic cross-sectional view of a display device taken along line II-II' of FIG. 1. FIGS. 3 and 4 are schematic cross-sectional views of display devices according to various embodiments, and are schematic cross-sectional views corresponding to line II-II' of FIG. 1.

Referring to FIGS. 1 to 4, a display device 1000 may include a display substrate 100, a display layer DPL including multiple display elements 200, and a signal controller 300. The display device 1000 may further include a power supply 400 disposed under (or below) the display substrate 100.

The display substrate 100 may have, for example, a polygonal column shape. A planar shape of the display substrate 100 may be a rectangular shape, but is not limited thereto. In an embodiment, the display substrate 100 may include an upper surface 100a, a lower surface 100b, and four side surfaces having, for example, a rectangular planar shape. However, the shape of the display substrate 100 is not limited to the described above. For example, the display substrate 100 may be formed in square, circles, ellipses, or other shapes in a plan view. An upper surface 100a or lower surface 100b of the display substrate 100 may include a curved surface. Accordingly, the display substrate 100 may be a curved display substrate. A size of the display substrate 100 is not limited. For example, at least one of side surfaces of the display substrate 100 may have a length more than about 3 meters.

The display substrate 100 may be a rigid substrate or a flexible substrate, and the material or physical properties thereof are not particularly limited. For example, the display substrate 100 may be a rigid substrate composed of glass or tempered glass, or a flexible substrate composed of a thin film of plastic or metallic material. The display substrate 100 may be a transparent substrate, but is not limited thereto. For example, the display substrate 100 may be a translucent substrate, an opaque substrate, or a reflective substrate.

The display substrate 100 may include a display area DA in which an image is displayed and a non-display area NDA other than the display area DA. The display area DA may be an area on which a display layer DPL is provided. The non-display area NDA may be an area on which the signal controller 300 which provides an image signal to the display layer DPL is disposed.

The display area DA may have various shapes. For example, the display area DA may be formed of various shapes such as a closed polygon including a side with a straight line, a circle, an ellipse, etc. including a side with a curved line, or a semicircle, a semi-ellipse, etc. including a side with a straight line and a curved line.

In case that the display area DA includes multiple areas, each area may also be formed of various shapes such as a closed polygon including sides of a straight line, a semi-circle, a semi-ellipse, etc. including sides of a curved line.

Sizes of the areas may be same or different from each other. As an example, will be described is a display device including a display area DA having a quadrangle shape including straight sides.

The non-display area NDA may be provided at a side of or adjacent to the display area DA. In an embodiment, the non-display area NDA may surround the display area DA.

The display layer DPL may be provided in the display area DA on the display substrate 100. The display layer DPL may include multiple display elements 200 and a fixing layer 500 for fixing the display elements 200.

The display elements 200 may receive an image signal and a power signal from the signal controller 300 and the power supply 400 and may display an image corresponding to the provided signals. Each of the display elements 200 may emit light with various colors, such as red, green, and/or blue. But, the light color is not particularly limited.

The display elements 200 may further include components such as transreceivers (e.g., antenna) that may receive and transmit image signals and power signals from the signal controller 300 and the power supply 400. The trans-receivers may receive and transmit the signals in a wired or wireless manner. The display elements 200 may further include a signal processing circuit for processing the provided image signals and a power control circuit for storing and controlling the provided power signals.

The display elements 200 may be distributed in the fixing layer 500 and may be disposed at various positions. Intervals between the display elements 200 may be different from each other, but are not limited thereto and may be the same.

The fixing layer 500 may be a medium in which the display elements 200 are dispersed, and may be formed of various resin compositions, which may be referred to as binders. However, the fixing layer is not limited thereto, and in the disclosure, any medium capable of dispersing display elements 200 may be referred to as a fixing layer regardless of its name, additional functions, and materials.

The fixing layer 500 may be formed thicker than a thickness of the display elements 200 to fill a space between the display elements 200 and may be disposed substantially flat. An upper surface of the fixing layer 500 may be substantially flat.

The display elements 200 dispersed in the fixing layer 500 may be disposed at various positions. For example, display element 2001 may be disposed in the fixing layer 500 so as not to contact the upper surface 100a of the display substrate 100. As another example, the display element 2002 may be disposed in the fixing layer 500 to contact the top surface 100a of the display substrate 100.

A shape of the fixing layer 500 is not limited to the described above. In another embodiment, as shown in FIG. 3, the display device 1000a may include a fixing layer 500a disposed on a surface thereof with substantially uniform thickness. For example, the fixing layer 500 may be disposed on a surface shape of both the display substrate 100 and the display elements 200 disposed on the display substrate 100. The display elements 200 may contact on the display substrate 100, but is not limited thereto.

As shown in FIGS. 2 and 3, the display layer DPL may be formed of a single layer disposed on the display substrate 100, but is not limited thereto. In another embodiment, as shown in FIG. 4, the display device 1000b may include multiple display layers DPL1 and DPL2. In detail, the display device 1000b may include a first display layer DPL1 disposed on the display substrate 100 and a second display layer DPL2 disposed on the first display layer DPL1. Each of the first display layer DPL1 and the second display layer DPL2 may include the fixing layer 500 and the display elements 200 distributed in the fixing layer 500.

Dispositions of the display elements 2003 and 2004 of the first display layer DPL1 and the display elements 2005 and 2006 of the second display layer DPL2 may be different from each other. Some of the display elements 2003 and 2004 of the first display layer DPL1 and the display elements 2005 and 2006 of the second display layer DPL2 may overlap each other in a third direction DR3. For example, the display element 2004 of the first display layer DPL1 may overlap the display element 2006 of the second display layer DPL2 in the third direction DR3.

FIG. 4 illustrates a schematic structure in which the display device 1000b includes two display layers DPL1 and DPL2, but the display device 1000b may include three or more display layers. In some embodiments, in case that the display device 1000b includes multiple display layers, the display device 1000b may function as a stereoscopic image display device that displays a stereoscopic image.

Referring to FIG. 1, the signal controller 300 may be disposed in the non-display area NDA on the display substrate 100. The signal controller 300 may provide an image signal to the display elements 200 and may control the operation of the display elements 200.

The signal controller 300 and the display elements 200 may be disposed apart from each other. For example, the signal controller 300 and the display elements 200 may not be electrically connected with each other, and the signal controller 300 may provide an image signal to the display elements 200 through wireless communication. Accordingly, the signal controller 300 may include a signal generating/transferring element for the wireless communication, and each of the display elements 200 may include a signal receiving element such as a transreceiver or an antenna to receive a provided signal. The communication is not limited to the wireless manner but may be performed in a wired manner.

The signal controller 300 may provide an image signal to the display elements 200 through various communication methods such as infrared ray communication, radio frequency communication, and the like, but is not limited thereto.

The signal controller 300 may be disposed adjacent to a side of the display substrate 100. However, the disposition of the signal controller 300 is not limited thereto. For example, the signal controller 300 may be disposed in the display area DA together with the display elements 200 or may be disposed on a separate member disposed outside the display substrate 100.

The power supply 400 may be disposed under the display substrate 100 to supply power signals to the display elements 200. The power supply 400 may be disposed in the display area DA of the display substrate 100 or may be disposed in both the display area DA and the non-display area NDA. However, the position of the power supply 400 is not limited thereto, and the power supply 400 may be disposed only in the non-display area NDA or may be disposed outside the display substrate 100.

The power supply 400 may be disposed apart from the display elements 200. The power supply 400 may transfer (wirelessly or with wire) power to the display elements 200. Accordingly, the power supply 400 may include a power transferring element for transferring (wirelessly or with wire) power, and each of the display elements 200 may include a power receiving element such as a transreceiver or an antenna to receive the provided power.

The power supply 400 may transfer power to the display elements 200 using an electromagnetic induction method or a magnetic resonance method, but is not limited thereto.

Figure 5:
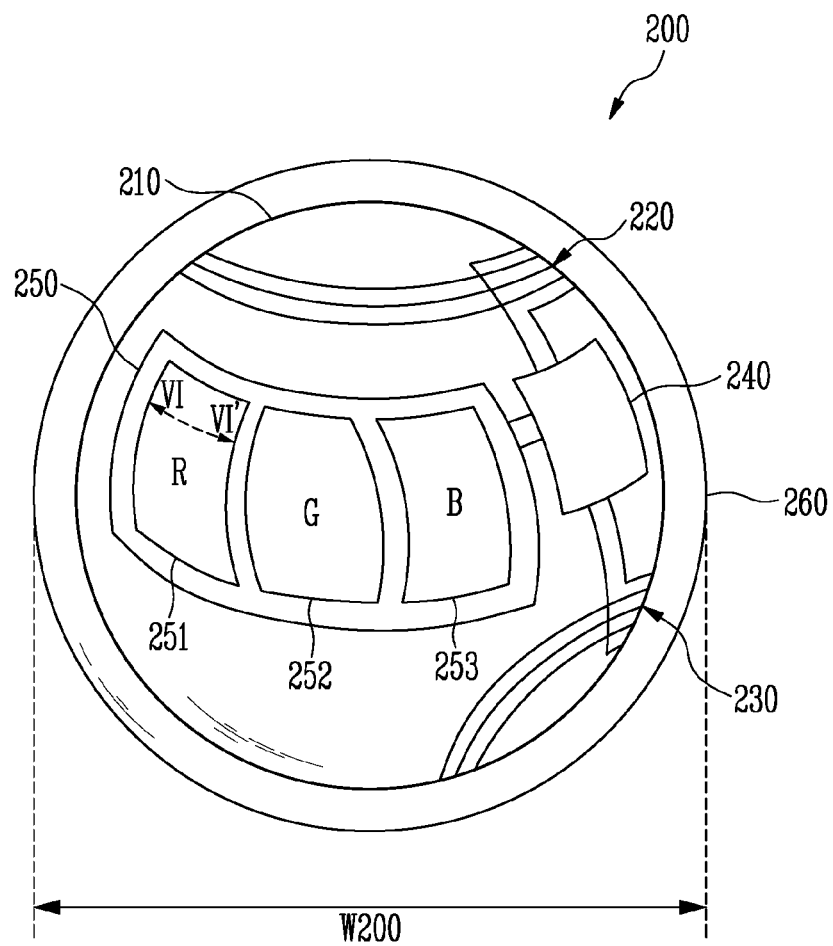
FIG. 5 is a schematic perspective view of a display element according to an embodiment.
Figure 6:
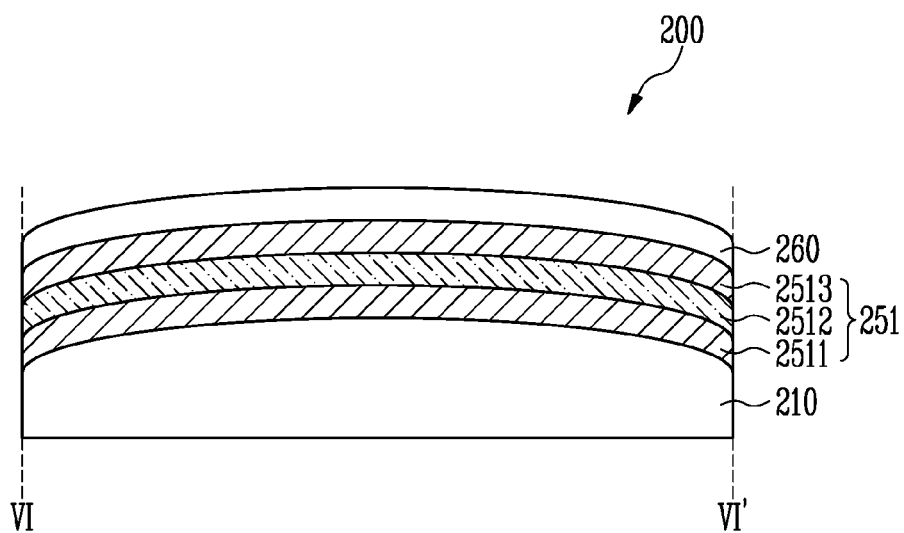
FIG. 6 is a schematic cross-sectional view of a display element taken along line VI-VI' of FIG. 5.
Figure 7:
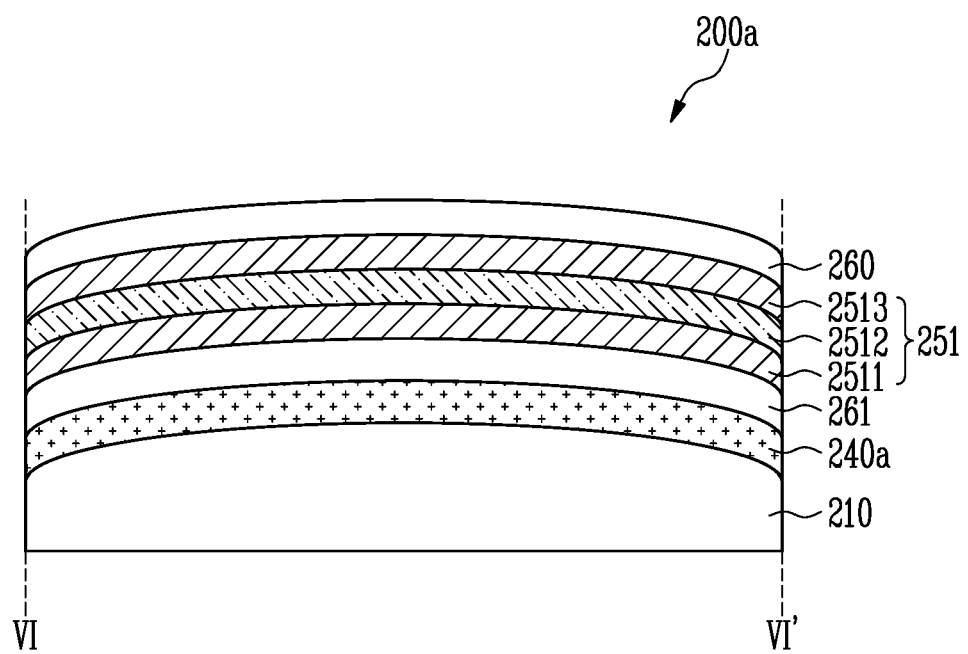
FIG. 7 illustrates a modification of a display device shown in FIG. 6, and is a schematic cross-sectional view corresponding to line VI-VI' of FIG. 5.

FIG. 5 is a schematic perspective view of a display element according to an embodiment. FIG. 6 is a schematic cross-sectional view of a display element taken along line VI-VI' of FIG. 5. FIG. 7 illustrates a modification of a display device shown in FIG. 6, and is a cross-sectional view corresponding to line VI-VI' of FIG. 5.

Referring to FIGS. 5 to 7, the display element 200 may include a base member 210, a first transreceiver 220, a second transreceiver 230, a driving circuit unit 240, a pixel 250, and an encapsulation layer 260.

The base member 210 may provide space for various components of the display element 200 to be disposed. The base member 210 may be made of a conductive substrate or an insulating substrate. For example, the base member 210 may be a substrate including various materials such as a silicon substrate, a sapphire substrate, a glass substrate, a silicon carbide substrate, and a conductive substrate or a semiconductor substrate made of a conductive material.

A shape of the base member 210 is not particularly limited. For example, as shown in FIG. 5, the base member 210 may have a ball-shape. FIGS. 5 to 7 illustrate that the base member 210 and the display element 200 including the base member 210 are formed in a spherical shape or a cylindrical shape, and the shape of the base member 210 and the display element 200 according to another embodiment will be described later with reference to FIGS. 9 and 10.

In case that the base member 210 is formed in a spherical shape, the base member 210 may be formed by freely falling a molten base material (e.g., silicon).

The first transreceiver 220 may be disposed in an area of the base member 210. The first transreceiver 220 may be configured with a conductive pattern including a conductive material, and may receive a power signal from the power supply 400 (see FIG. 2). For example, the first transreceiver 220 may be a power receiving element.

FIG. 5 illustrates a structure in which the first transreceiver 220 spirally surrounds the curved surface of the base member 210. For example, the first unit 220 may be a helical antenna, but is not limited thereto. The first transreceiver 220 may be configured with various power receiving elements such as a loop-type antenna.

The second transreceiver 230 may be disposed in one area of the base member 210 that does not overlap the first transreceiver 220. The second transreceiver 230 may be configured with a conductive pattern including a conductive material, and may receive an image signal from the signal controller 300 (see FIG. 1). For example, the second transreceiver 230 may be a signal receiving element. The second transreceiver 230 may be configured with an antenna of various shapes such as the first transreceiver 220.

The driving circuit 240 may be disposed on the base member 210. The driving circuit 240 may receive a power signal and an image signal, and may generate a pixel driving signal for driving the pixel 250 based on the power signal and the image signal. For example, the driving circuit 240 may receive a power signal from the first unit 220, and may receive an image signal from the second transreceiver 230.

The driving circuit 240 may include various circuit elements for the signal processing, the signal generation, and the like, and the circuit elements may be implemented as an integrated circuit (IC) and disposed on the base member 210. Various components included in the driving circuit 240 will be described later with reference to FIG. 8.

The driving circuit 240 may be partially formed on the surface of the base member 210, but is not limited thereto. The driving circuit 240 may be entirely formed on the surface of the base member 210 in an area that does not overlap the first transreceiver 220, the second transreceiver 230, and the pixel 250.

The pixel 250 may be disposed on the base member 210. The pixel 250 may emit light of various colors in response to the pixel driving signal provided from the driving circuit unit 240. The pixel 250 may include a first pixel 251, a second pixel 252 and a third pixel 253.

The first pixel 251, the second pixel 252 and the third pixel 253 may be pixels emitting light of different colors. For example, the first pixel 251 may emit light of a first color, the second pixel 252 may emit light of a second color different from the first color, and the third pixel 253 may emit light of a third color different from the first and second colors.

According to an embodiment, the first pixel 251 may be a red pixel emitting red light, the second pixel 252 may be a green pixel emitting green light, and the third pixel 253 may be a blue pixel emitting blue light. The color of light emitted by each of the pixels 251, 252, and 253 is not limited thereto, and in another embodiment, each of the pixels 251, 252, and 253 may emit one of cyan, magenta, yellow, and white. Accordingly, the pixel 250 may display light of various colors by combining light of different colors emitted from each of the pixels 251, 252, and 253.

Since cross-sectional structures of each of the pixels 251, 252, and 253 are substantially equivalent or similar, the structure of the first pixel 251 will be described below, and the description of the structures of the second pixel 252 and third pixel 253 will be briefly or omitted.

As shown in FIG. 6, the first pixel 251 may include a first electrode layer 2511, an emission layer 2512, and a second electrode layer 2513 sequentially stacked between the base member 210 and the encapsulation layer 260.

The first electrode layer 2511 may be formed on the surface of the base member 210 with substantially uniform thickness. The first electrode layer 2511 may include a conductive material such as a metal. For example, the first electrode layer 2511 may be a metal layer including metals such as Ag, Mg, Al, Pt, Pd, Au, Ni, Nd, Ir, and/or Cr. As another example, the first electrode layer 2511 may further include a metal oxide layer, and may have a two-layer structure of ITO/Ag, Ag/ITO, ITO/Mg, ITO/MgF, or a multilayer structure such as ITO/Al/ITO. However, the material of the first electrode layer 2511 is not limited to the material described above as long as it is a material capable of transferring the provided electrical signal.

The emission layer 2512 may be disposed on the first electrode layer 2511. The emission layer 2512 may emit light having a color by including an organic emission layer including an organic material or an inorganic emission layer including an inorganic material.

For example, when the emission layer 2512 may include an organic emission layer, the emission layer 2512 may include a hole transporting layer, an organic material layer and an electron transporting layer.

As another example, in case that the emission layer 2512 includes an inorganic emission layer, the light emission layer 2512 may include a first semiconductor layer doped with p-type dopants such as Mg, Zn, Ca, Sr, and/or Ba, a second semiconductor layer doped with n-type dopants such as Si, Ge, and/or Sn, and an active layer (e.g., quantum well layer) disposed between the first semiconductor layer and the second semiconductor layer.

The second electrode layer 2513 may be disposed on the emission layer 2512. The second electrode layer 2513 may include a conductive material layer having a low work function such as Li, Ca, LiF/Ca, LiF/Al, Al, Mg, Ag, Pt, Pd, Ni, Au Nd, Ir, Cr, BaF, Ba, or a compound or mixture thereof (e.g., mixture of Ag and Mg, etc.). The second electrode layer 2513 may further include a transparent metal oxide layer disposed on a conductive material layer having a low work function.

The first electrode layer 2511, the emission layer 2512 and the second electrode layer 2513 described above may be disposed to be bent in accordance with a curvature of the surface of the base member 210.

The first electrode layer 2511 may be formed directly on the base member 210, but other components may be further disposed between the first electrode layer 2511 and the base member 210. For example, as shown in FIG. 7, at least some driving circuit layer 240a may be further disposed between the first electrode layer 2511 and the base member 210 of the display element 200a. For example, the driving circuit layer 240a may be formed on the base member 210, the first encapsulation layer 261 may be formed on the driving circuit layer 240a, and the first pixel 251 may be formed on the first encapsulation layer 261. In case that the driving circuit layer 240a and the pixel 250 are formed of a multilayer structure in an embodiment, a space for forming the pixel 250 may be secured. Accordingly, a display luminance of the display element 200 may be improved.

The encapsulation layer 260 may be disposed at the outermost portion of the display element 200 to protect the components disposed on the base member 210. The encapsulation layer 260 may include inorganic materials such as silicon oxide, silicon nitride, silicon oxynitride, aluminum oxide, aluminum nitride, titanium oxide or titanium nitride, or organic materials such as polyimide, polyester, and acryl, and may be formed of a plurality of laminates of the above materials.

As described above, in case that the display element 200 is formed in a spherical shape, the display element 200 may be formed in a small size having a diameter W200 (or size) of about 1 μm to about 500 μm. For example, the diameter W200 of the display element 200 may be about 100 μm or less.

Figure 8:
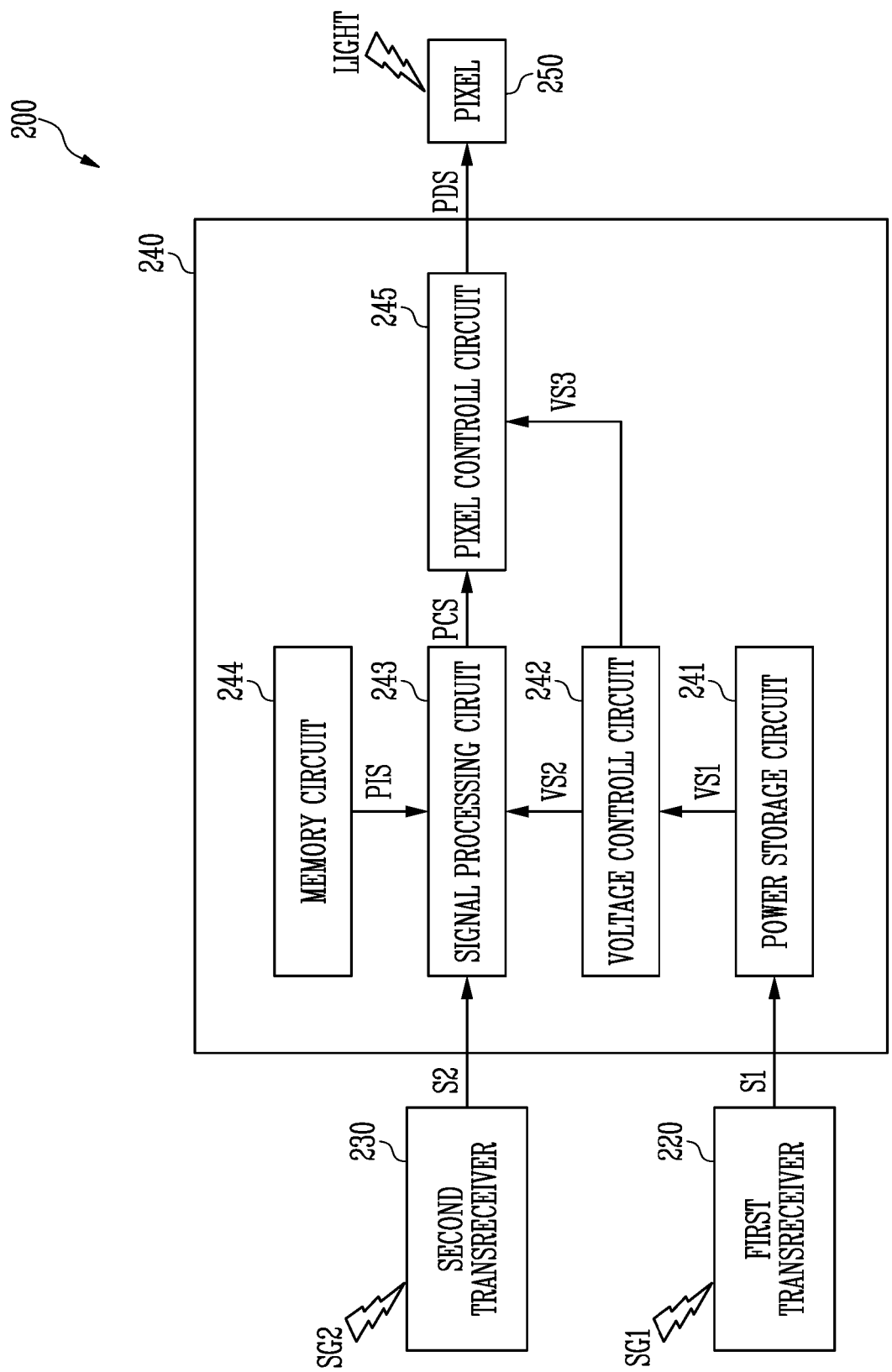
FIG. 8 is a block diagram schematically illustrating components of a display element according to an embodiment.

FIG. 8 is a block diagram schematically illustrating components of a display element according to an embodiment. FIG. 8 illustrates various components which the driving circuit 240 includes.

Referring to FIGS. 1, 5 and 8, the display element 200 may include a first transreceiver 220, a second transreceiver 230, a driving circuit 240 and a pixel 250 disposed on the base member 210.

The first transreceiver 220 may receive a power signal SG1 from the power supply 400 (see FIG. 2). As described above, the first transreceiver 220 may receive the power signal SG1 from the power supply 400 through various methods such as an electromagnetic induction method or a magnetic resonance method.

The first transreceiver 220 may transfer the power signal SG1 provided from the power supply 400 to the driving circuit 240 transferring In detail, the first transreceiver 220 may provide a power signal S1 to the power storage circuit 241 of the driving circuit 240.

The power storage circuit 241 may receive the power signal S1 from the first transreceiver 220 and store it therein. For example, the power storage circuit 241 can store the power signal S1 for short or long time, including capacitors. If desired, the power storage circuit 241 may provide power (or power source) stored therein to the voltage control circuit 242 as a first voltage signal VS1.

The voltage control circuit 242 may generate a second voltage signal VS2 and a third voltage signal VS3 based on the first voltage signal VS1 provided from the power storage circuit 241. The voltage control circuit 242 may divide the provided first voltage signal VS1 into voltages of various magnitudes, including partial pressure elements, and provide divided voltages to other components. Accordingly, the voltage control circuit 242 may generate a second voltage signal VS2 and provide the second voltage signal VS2 to the signal processing circuit 243, and may generate a third voltage signal VS3 and provide the third voltage signal VS3 to the pixel control circuit 245.

The second transreceiver 230 may transfer an image signal SG2 provided from the signal controller 300 to the driving circuit 240. In detail, the second transreceiver 230 may provide an image signal S2 to the signal processing circuit 243 of the driving circuit 240. The image signal S2 provided to the signal processing circuit 243 may be a signal including information on a light emission color, light emission intensity, a light emission time, and the like of the display elements 200.

The shape of the first transreceiver 220 and the second transreceiver 230 described above may be a coil shape provided on each area of the base member 210, as shown in FIG. 5, but is not limited thereto as long as a structure capable of receiving the power signal SG1 or the image signal SG2. For example, the first transreceiver 220 and the second transreceiver 230 may be one of various known antennas. In an embodiment, the first transreceiver 220 and/or the second transreceiver 230 may include a dipole antenna. When the first transreceiver 220 or the second transreceiver 230 includes the dipole antenna, it may be advantageous to miniaturize the display element 200. The display element 200 may effectively receive a short wavelength signal through the first transreceiver 220 and/or the second transreceiver 230.

Position information on the display substrate 100 of the corresponding display element 200 may be recorded in the memory circuit 244. The position information may be obtained by emitting the display elements 200 disposed on the display substrate 100, after a process of disposing the display elements 200 on the display substrate 100 is finished among a manufacturing process of the display device. For example, the position information may be distance information from each side of the display substrate 100. The obtained position information may be recorded in the memory circuit 244 of each display element 200 corresponding to the position information.

The process of recording the position information in the memory circuit 244 may be performed wirelessly through the second transreceiver 230 and the signal processing circuit 243. In case that driving the display device, the memory circuit 244 may provide prestored position information to the signal processing circuit 243 as a position information signal PIS.

The signal processing circuit 243 may generate a pixel control signal PCS based on the image signal S2 provided from the second transreceiver 230, the second voltage signal VS2 provided from the voltage control circuit 242, and the position information signal PIS provided from the memory circuit 244. The pixel control signal PCS may include information on a light emission luminance, a light emission color, a light emission time, and the like of the corresponding display element 200.

The signal processing circuit 243 may specify an image signal corresponding to the display element 200 by comparing the position information on the display elements 200 included in the provided image signal S2 with the position information of the corresponding display element 200 prestored in the memory circuit 244. The image signal S2 provided from the second transreceiver 230 may include an image signal for multiple display elements 200 disposed on the display substrate 100, and the signal processing circuit 243 may generate the pixel control signal PCS by specifying only the image signal required for the corresponding display element 200 among the image signals.

The pixel control circuit 245 may generate a pixel driving signal PDS based on the pixel control signal PCS and the third voltage signal VS3 provided from the signal processing circuit 243. pixel driving signal PDS may be a driving current or a driving voltage for substantially driving the pixel 250. The pixel 250 may emit light with a light emission luminance, a light emission color, and light emission time corresponding to the pixel driving signal PDS.

Figure 9:
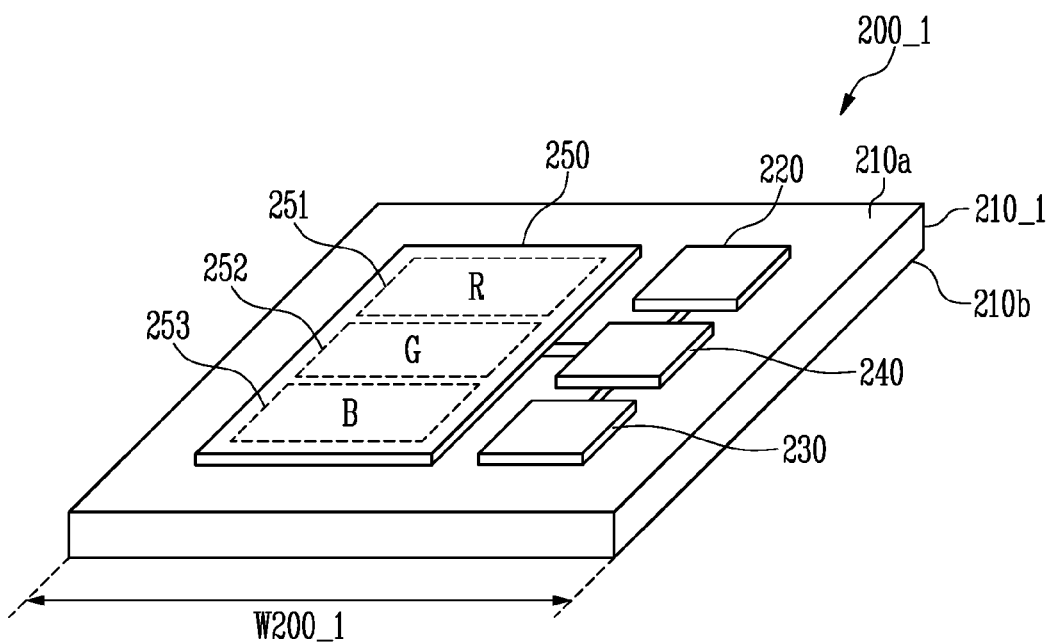
FIGS. 9 and 10 are schematic perspective views of display elements according to various embodiments.
Figure 10:
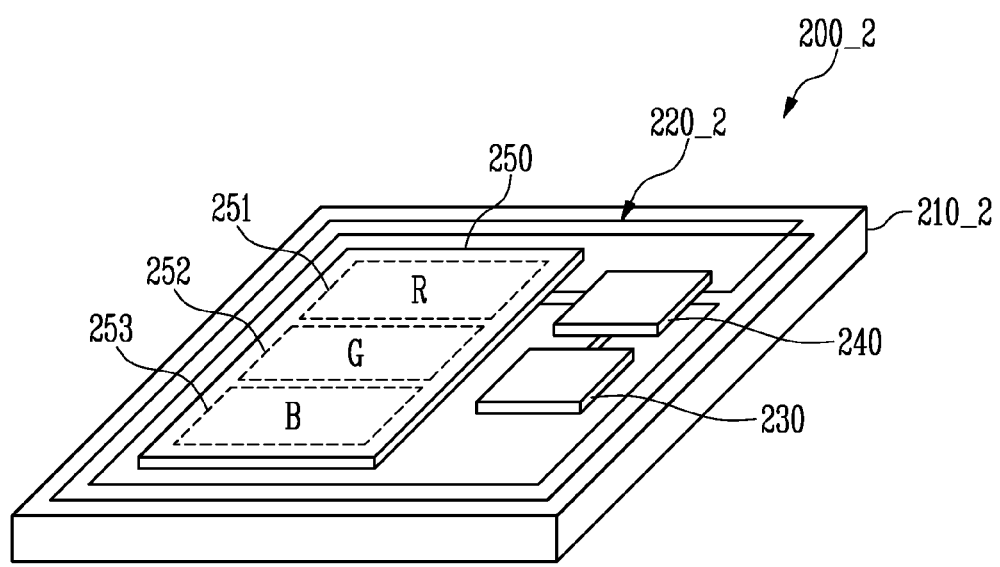

FIGS. 9 and 10 are schematic perspective views of display elements according to various embodiments.

Embodiments shown in FIGS. 9 and 10 differ from the above-described embodiments. For example, a substrate of a display element has a flat plate shape. For the elements and configurations that are substantially same or similar with those of the above-described embodiments, detailed descriptions will be omitted only for the purpose of avoiding redundant description.

Referring to FIG. 9, a display element 200_1 may include a base member 210_1, and the first transreceiver 220, the second transreceiver 230, the driving circuit 240, and the pixel 250 disposed on the base member 210_1.

The base member 210_1 may have a flat plate shape including an upper surface 210*a* and a lower surface 210*b* substantially parallel to the upper surface 210*a*. In FIG. 9, the base member 210_1 has a quadrangular structure in a plan view, but is not limited thereto. In another embodiment, the base member 210_1 may be circular in a plan view. In this case, the member 210_1 may have a disk shape.

Various components of the display element 200_1 including the pixel 250 may be disposed on the upper surface 210*a* of the base member 210_1. In an embodiment, the pixel 250 may be disposed on both the upper surface 210*a* and the lower surface 210*b* of the base member 210_1. At least one of the first transreceiver 220, the second transreceiver 230, and the driving circuit 240 of the display element 200_1 may be disposed on the lower surface 210b of the base member 210_1. The components disposed on the upper surface 210a and the lower surface 210b of the base member 210_1 may be electrically connected to each other through a connection part passing through the base member 210_1. But, the configuration and connection of the components are not limited thereto.

As described with reference to FIG. 7, at least a portion of the driving circuit 240 may be disposed under the pixel 250. In the case, since a space for forming the pixel 250 is wider, a display luminance of the display element 200 may be improved.

The first transreceiver 220 and the second transreceiver 230 disposed on the base member 210_1 may be disposed in the form of a coil in areas not overlapping each other. The shape of the first transreceiver 220 and the second transreceiver 230 is not limited thereto and may be more various. For example, the first transreceiver 220 and/or the second transreceiver 230 may include a dipole antenna. In case that the first transreceiver 220 and/or the second transreceiver 230 is/are implemented with dipole antenna(s), the display element 200 or 200_1 may be advantageously miniaturized. The display element 200 or 200_1 may effectively receive a short wavelength signal through the first transreceiver 220 and/or the second transreceiver 230.

In an embodiment shown in FIG. 10, a display element 200_2 includes a first transreceiver 220_2 having a form of a wound coil to surround a boundary of a base member 210_2.

As described above, in case that the display element 200_1 or 200_2 is formed in a plate shape, the display element 200_1 or 200_2 may be formed in a small size having a width W200_1 (or size) in a range of about 1 μm to about 500 μm. For example, the width W200_1 of the display element 200_1 may be about 100 μm or less.

are schematic perspective views for illustrating a manufacturing method of a display device according to an embodiment. The method of manufacturing the display device shown in FIGS. 11 to 13 may be the method of manufacturing the display device shown in FIGS. 1 and 2, and the display device shown in FIGS. 11 to 13 may be include the display elements according to an embodiment of FIG. 5.

The method of manufacturing the display device according to an embodiment will be described with reference to FIGS. 11 to 13 together with FIGS. 1 and 2.

As shown in FIG. 11, the display substrate 100 including the display area DA and the non-display area NDA adjacent to or surrounding the display area DA may be prepared. The display area DA may be an area for displaying an image, and the non-display area NDA may be an area other than the display area DA.

The shape of the display substrate 100 is not limited to the shape shown in the drawings. FIGS. 11 to 13 illustrate the display substrate 100 having a flat plate structure (for example, a rectangular parallelepiped shape) which is rectangular in a plan view, but the display substrate 100 may have various shapes such as polygons such as triangles and pentagons, circles, ellipses, and the like in a plan view. Also, the shapes of side surfaces the display substrate 100 are not limited to those shown in the drawings. For example, the display substrate 100 may be a curved display substrate having curved upper and lower surfaces. The size of the display substrate 100 is not limited. For example, the display substrate 100 may be a large display substrate of which a length of at least one side is about three meters or more.

Figure 12:
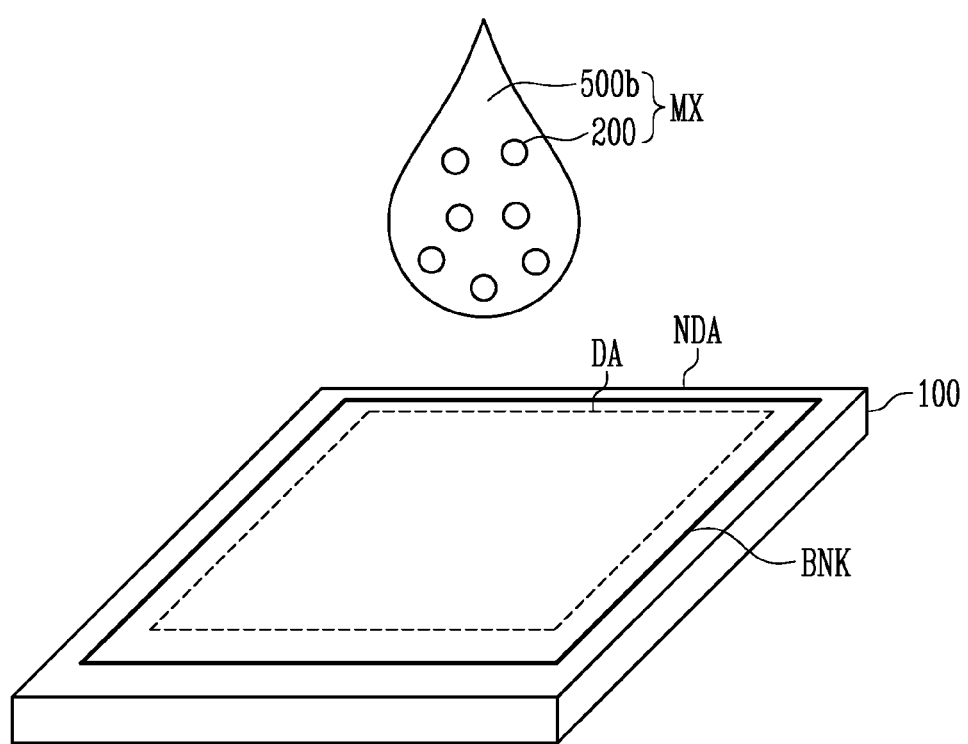

Referring to FIG. 12, multiple display elements 200 may be dispersed in a fixing material 500b to form a mixture MX, and the mixture MX may be applied on a surface of the display substrate 100 in the display area DA.

The display elements 200 may be evenly dispersed in the fixing material 500b and the concentration of the display elements 200 in the mixture MX may be uniform. The concentration of the mixture MX may vary according to the number of the display elements 200 dispersed in the fixing material 500b. The number of the display elements 200 disposed on the display substrate 100 may be controlled by changing or controlling the concentration of the mixture MX.

As described above, since each of the display elements 200 includes an encapsulation layer 260 (see FIG. 5) disposed at the outermost portion, other components of the display elements 200 may be protected by the encapsulation layer 260 when the display elements 200 are dispersed in the fixed material 500b.

According to an embodiment, before applying the mixture MX on the display substrate 100, a bank BNK adjacent to or surrounding the display area DA may be further formed in the non-display area NDA.

The bank BNK may determine an area where the mixture MX is applied so that the mixture MX may be stably applied in the display area DA of the display substrate 100. The bank BNK may be formed to have a hill shape (or include a hill) on the display substrate 100 to prevent the mixture MX from overflowing to the outside of the display area DA. The bank BNK may be formed before applying the mixture MX, and may be removed after applying the mixture MX. However, in some embodiments, the bank BNK may not be removed even after applying the mixture MX.

Figure 13:
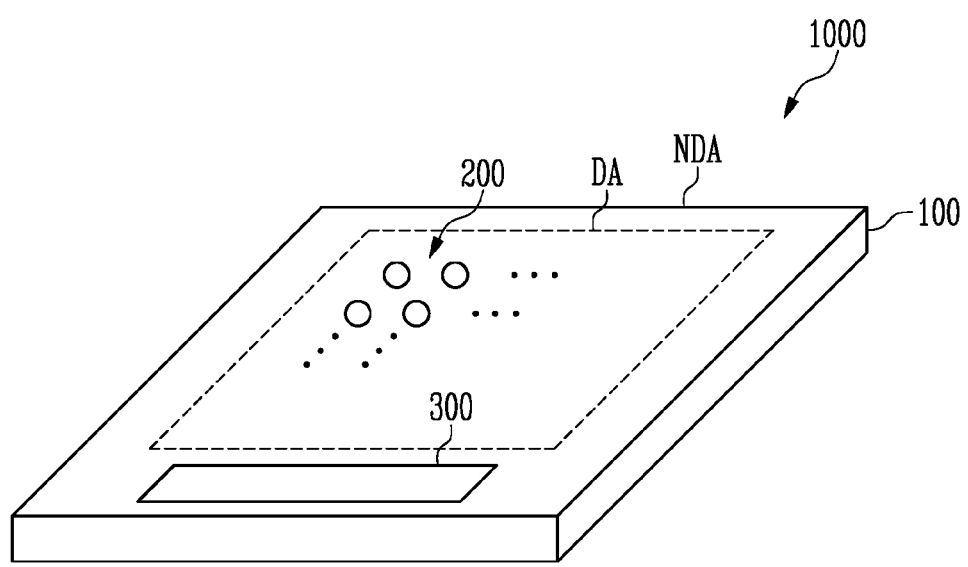

Referring to FIG. 13, the display elements 200 may be disposed on the display substrate 100, and a power supply 400 (see FIG. 2) supplying a power signal to the display elements 200 and a signal controller 300 supplying an image signal may be formed.

The power supply 400 may be disposed on a surface opposite to a surface on which the display elements 200 of the display substrate 100 are disposed (see FIG. 2). The power supply 400 may transfer (for example, wirelessly) power to the display elements 200. The signal controller 300 may be disposed in the non-display area NDA of the display substrate 100. The signal controller 300 may transfer (for example, wirelessly) an image signal to the display elements 200. The positions of the power supply 400 and the signal controller 300 are not limited to the above.

Each of the applied display elements 200 may emit light, and the position information of each of the display elements 200 may be recorded in each of the display elements 200. Such light emission and recordation of the position information may occur or be performed when the power and/or the image signal is/are transferred to the display elements 200. As described above with reference to FIG. 8, each of the display elements 200 may include the memory circuit 244 (see FIG. 8), and the position information of each of the display elements 200 may be recorded in the memory circuit 244.

Specifically, each of the display elements 200 may be provided with recognition information during the manufacturing process. After applying the display elements 200 on the display substrate 100, the signal controller 300 may provide an emission signal to the display elements 200 according to predetermined recognition information.

For example, when first recognition information is given to the first display element and second recognition information is given to the second display element, the first display element may emit light in response to a first emission signal according to the first recognition information provided by the signal controller 300, and the second display element may not emit light. According to a light emission of the first display element, first position information of the first display element may be obtained, and the signal controller 300 may provide a signal including the first position information to the first display element. Accordingly, the first position information may be recorded in the memory circuit of the first display element. Thereafter, the signal controller 300 may provide a second emission signal according to the second recognition information, and the above-described processes may be repeated.

As a result, the position information of all the display elements 200 disposed on the display substrate 100 may be recorded, and the display elements 200 may emit light to display an image by using recorded position information when the display device is driven.

The method of recording position information on the display elements 200 is not limited thereto, and may be implemented in more various methods. In other embodiments, the display device may record position information of each display element 200 using communication between the display elements 200 applied on the display substrate 100. For example, positions of some (or at least two) of the display elements 200 applied on the display substrate 100 may be recorded, and positions of the other display elements 200 may be recorded based on the recorded display elements 200 or by use of a communication between the some (or the at least two) of the display elements 200.

For example, the position of each display element may be recorded in first to third display elements, which may be randomly chosen display elements among the display elements 200 applied on the display substrate 100. A fourth display element in which position information is not recorded may receive position information from the first to third display elements. The fourth display element may calculate the position information of the fourth display element based on the position information of the first to third display elements and store it in a memory circuit thereof. Other display elements in which position information is not recorded may also repeat the above-described operation to receive position information from the other display elements and to record their own position information in their memory circuit. Herein, the fourth display element may be a display element adjacent to the first to third display elements, and the communication between the display elements 200 may be phonon communication using a phonon, but is not limited thereto.

According to the embodiments of the display device and the manufacturing method thereof, small size display elements may be provided to perform a display function alone or for itself by means of transmitting/receiving (for example, wirelessly) a power signal and an image signal. The display device may be manufactured by applying the mixture mixed with the display elements on the display substrate. One of the advantages is that a large size display device can be readily or more efficiently manufactured without limits on a display substrate which otherwise would accompany difficulties in manufacturing a large size display device. Also, in case that a display substrate has a complex shape such as a curved shape, the display device may be readily or more efficiently manufactured by applying a mixture including the display elements. As a result, manufacturing display devices of relatively large sizes and/or having various shapes can be accomplished without causing a substantial cost increase or with an economic cost.

While embodiments of the invention are described with reference to the attached drawings, those with ordinary skill in the technical field invention pertains will be understood that the invention can be carried out in other specific forms without changing the technical idea or essential features. Accordingly, the above-described embodiments should be considered in descriptive sense only and not for purposes of limitation.

What is claimed is:

1. A display device comprising:
   a first display layer disposed on a surface of a display substrate and including a display element;
   a power supply that supplies a power signal to the display element; and
   a signal controller that supplies an image signal to the display element,
   wherein the display element includes:
   a base member;
   a pixel disposed on a surface of the base member;
   a driving circuit that provides a pixel driving signal to the pixel;
   a first transreceiver that receives the power signal and transmits the power signal to the driving circuit; and
   a second transreceiver that receives the image signal and transmits the image signal to the driving circuit, and
   wherein the driving circuit includes:
   a power storage circuit that stores the power signal and outputs a first voltage signal; and
   a voltage control circuit that generates a second voltage signal and a third voltage signal based on the first voltage signal.

2. The display device of claim 1, wherein the base member has a ball-shape.

3. The display device of claim 2, wherein at least one of the first transreceiver and the second transreceiver are disposed on the surface of the base member.

4. The display device of claim 2, wherein the pixel includes:
   a first electrode layer disposed on the base member,
   an emission layer disposed on the first electrode layer, and
   a second electrode layer disposed on the emission layer,
   wherein at least one of the first electrode layer, the emission layer, and the second electrode layer is curved along the surface of the base member.

5. The display device of claim 4, wherein the emission layer includes an organic material.

6. The display device of claim 4, wherein the emission layer includes an inorganic material.

7. The display device of claim 4, wherein at least a portion of the driving circuit is disposed between the base member and the first electrode layer.

8. The display device of claim 1, wherein
   the base member has a substantially flat plate shape, and
   the surface of the base member where the pixel is disposed has a flat shape.

9. The display device of claim 1, wherein the display element has a size in a range from about 1 μm to about 500 μm.

10. The display device of claim 1, wherein the driving circuit further includes:
    a memory circuit that stores position information of the display element and outputs a position information signal including the position information; and a signal processing circuit that generates a pixel control signal based on the image signal, the second voltage signal, and the position information signal.

11. The display device of claim 10, wherein the driving circuit further includes:
a pixel control circuit that provides the pixel driving signal to the pixel based on the pixel control signal and the third voltage signal.

12. The display device of claim 1, wherein the first display layer includes a fixing layer disposed on the display element.

13. The display device of claim 12, further comprising a second display layer disposed on the first display layer,
wherein the second display layer includes the display element.

14. A method of manufacturing a display device, comprising:
preparing a display substrate including a display area and a non-display area adjacent to the display area;
dispersing display elements in a fixing material to form a mixture; and
applying the mixture on a surface of the display substrate in the display area,
wherein the method includes:
forming a base member for each of the display elements;
forming a pixel on the base member;
forming a driving circuit that generates a pixel driving signal based on a power signal and an image signal and provides the pixel driving signal to the pixel;
forming a first transreceiver that provides the power signal to the driving circuit; and
forming a second transreceiver that provides the image signal to the driving circuit,
wherein the driving circuit includes:
a power storage circuit that stores the power signal and outputs a first voltage signal; and
a voltage control circuit that generates a second voltage signal and a third voltage signal based on the first voltage signal.

15. The method of claim 14, further comprising:
emitting the display elements applied on the display substrate; and
obtaining position information of each of the display elements to record the position information on a corresponding display element.

16. The method of claim 15, further comprising:
storing the position information in a memory.

17. The method of claim 14, further comprising:
forming a power supply on another surface of the display substrate to supply the power signal to the display elements; and
forming a signal controller on the non-display area to supply the image signal to the display elements.

18. The method of claim 14, further comprising:
forming a bank surrounding the display area in the non-display area before the applying of the mixture.

19. The method of claim 14, further comprising:
recording position information on at least two of the display elements; and
recording position information on others of the display elements by use of a communication between the at least two of the display elements.

20. A display device comprising:
a first display layer disposed on a surface of a display substrate and including a display element;
a power supply that supplies a power signal to the display element; and
a signal controller that supplies an image signal to the display element, wherein
the display element includes:
a base member;
a pixel disposed on a surface of the base member;
a driving circuit that generates and transmits a pixel driving signal to the pixel;
a first transreceiver that receives the power signal and transmits the power signal to the driving circuit; and
a second transreceiver that receives the image signal and transmits the image signal to the driving circuit, wherein
the driving circuit includes a memory circuit that stores position information of the display element and outputs a position information signal including the position information, and
the pixel driving signal is based on the position information, the power signal, and the image signal.

* * * * *